(12) United States Patent
Wittmann et al.

(10) Patent No.: US 10,177,293 B2
(45) Date of Patent: Jan. 8, 2019

(54) OPTOELECTRONIC COMPONENT AND METHOD OF PRODUCING AN OPTOELECTRONIC COMPONENT

(71) Applicant: OSRAM Opto Semiconductors Gmbh, Regensburg (DE)

(72) Inventors: Michael Wittmann, Alteglofsheim (DE); Tobias Gebuhr, Regensburg (DE); David Racz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/524,644

(22) PCT Filed: Nov. 5, 2015

(86) PCT No.: PCT/EP2015/075803
§ 371 (c)(1),
(2) Date: May 5, 2017

(87) PCT Pub. No.: WO2016/071440
PCT Pub. Date: May 12, 2016

(65) Prior Publication Data
US 2017/0324012 A1    Nov. 9, 2017

(30) Foreign Application Priority Data

Nov. 5, 2014 (DE) .......................... 10 2014 116 133

(51) Int. Cl.
*H01L 33/62* (2010.01)
*H01L 33/48* (2010.01)
*H01L 33/50* (2010.01)

(52) U.S. Cl.
CPC ............ *H01L 33/62* (2013.01); *H01L 33/486* (2013.01); *H01L 33/50* (2013.01); *H01L 2933/0041* (2013.01); *H01L 2933/0066* (2013.01)

(58) Field of Classification Search
CPC .............................. H01L 33/62; H01L 33/486
(Continued)

(56) References Cited

U.S. PATENT DOCUMENTS

2002/0089064 A1 * 7/2002 Wu ................... H01L 23/49544
257/773
2003/0075724 A1    4/2003 Wang et al.
(Continued)

FOREIGN PATENT DOCUMENTS

DE       199 01 918 A1    7/1999
DE  10 2005 004 616 A1    9/2005
(Continued)

*Primary Examiner* — Jami Valentine Miller
(74) *Attorney, Agent, or Firm* — DLA Piper LLP (US)

(57) ABSTRACT

An optoelectronic component includes a first lead frame section and a second lead frame section spaced apart from one another, and having an optoelectronic semiconductor chip arranged on the first lead frame section and the second lead frame section, wherein the first lead frame section and the second lead frame section respectively have an upper side, a lower side and a first side flank extending between the upper side and the lower side, a first lateral solder contact surface of the optoelectronic component is formed on the first side flank of the first lead frame section, and the first lateral solder contact surface is formed by a recess arranged on the first side flank of the first lead frame section and extends from the upper side to the lower side of the first lead frame section.

18 Claims, 14 Drawing Sheets

(58) Field of Classification Search
USPC .......................................................... 257/99
See application file for complete search history.

(56) References Cited

U.S. PATENT DOCUMENTS

| | | | |
|---|---|---|---|
| 2004/0188696 A1* | 9/2004 | Hsing Chen | ............ H01L 24/97 257/99 |
| 2007/0012939 A1* | 1/2007 | Hwang | ................... H01L 33/08 257/99 |
| 2007/0170461 A1* | 7/2007 | Kamei | ................... H01L 33/40 257/133 |
| 2007/0187666 A1* | 8/2007 | Watanabe | ............. H01L 33/007 257/13 |
| 2008/0291691 A1 | 11/2008 | Ishizaka et al. | |
| 2013/0270602 A1 | 10/2013 | Ko et al. | |
| 2014/0225139 A1 | 8/2014 | Park et al. | |

FOREIGN PATENT DOCUMENTS

| | | |
|---|---|---|
| DE | 10 2012 109 139 A1 | 3/2014 |
| DE | 10 2014 103 034 A1 | 9/2015 |
| EP | 2 120 518 A2 | 11/2009 |
| JP | 07-131072 A | 5/1995 |

* cited by examiner

OPTOELECTRONIC COMPONENT AND METHOD OF PRODUCING AN OPTOELECTRONIC COMPONENT

TECHNICAL FIELD

This disclosure relates to an optoelectronic component, a method of producing an optoelectronic component and a method of producing an optoelectronic arrangement.

BACKGROUND

Various housing shapes for optoelectronic components are known. In known housings of optoelectronic components, an optoelectronic semiconductor chip of the optoelectronic component is arranged in a gap, bounded by a housing wall, of the housing. Minimum thickness of the housing walls and minimum distances between the housing walls and the optoelectronic semiconductor, required for mechanical reasons, in this case limit the possibilities for miniaturization in the optoelectronic components.

SUMMARY

We provide an optoelectronic component including a first lead frame section and a second lead frame section spaced apart from one another, and an optoelectronic semiconductor chip arranged on the first lead frame section and the second lead frame section, wherein the first lead frame section and the second lead frame section respectively have an upper side, a lower side and a first side flank extending between the upper side and the lower side, a first lateral solder contact surface of the optoelectronic component is formed on the first side flank of the first lead frame section, the first lateral solder contact surface is formed by a recess arranged on the first side flank of the first lead frame section and extends from the upper side to the lower side of the first lead frame section.

We also provide a method of producing an optoelectronic component including providing a lead frame having an upper side and a lower side, the lead frame including a first lead frame section and a second lead frame section; forming a through-opening, extending from the upper side to the lower side, in the lead frame; arranging an optoelectronic semiconductor chip on the first lead frame section and the second lead frame section; and dividing the lead frame to individualize the optoelectronic component, a separating plane extending through the through-opening during division of the lead frame, a first side flank extending from the upper side to the lower side respectively being formed by the division at the first lead frame section and at the second lead frame section on the separating plane, a first lateral solder contact surface being formed by a wall of the through-opening on the first side flank of the first lead frame section.

We further provide a method of producing an optoelectronic arrangement including producing an optoelectronic component by the method of producing an optoelectronic component including providing a lead frame having an upper side and a lower side, the lead frame including a first lead frame section and a second lead frame section; forming a through-opening, extending from the upper side to the lower side, in the lead frame; arranging an optoelectronic semiconductor chip on the first lead frame section and the second lead frame section; and dividing the lead frame to individualize the optoelectronic component, a separating plane extending through the through-opening during division of the lead frame, a first side flank extending from the upper side to the lower side respectively being formed by the division at the first lead frame section and at the second lead frame section on the separating plane, a first lateral solder contact surface being formed by a wall of the through-opening on the first side flank of the first lead frame section; and arranging the optoelectronic component on a circuit board, the first side flanks of the first lead frame section and the second lead frame section facing toward the circuit board.

Figure 1:
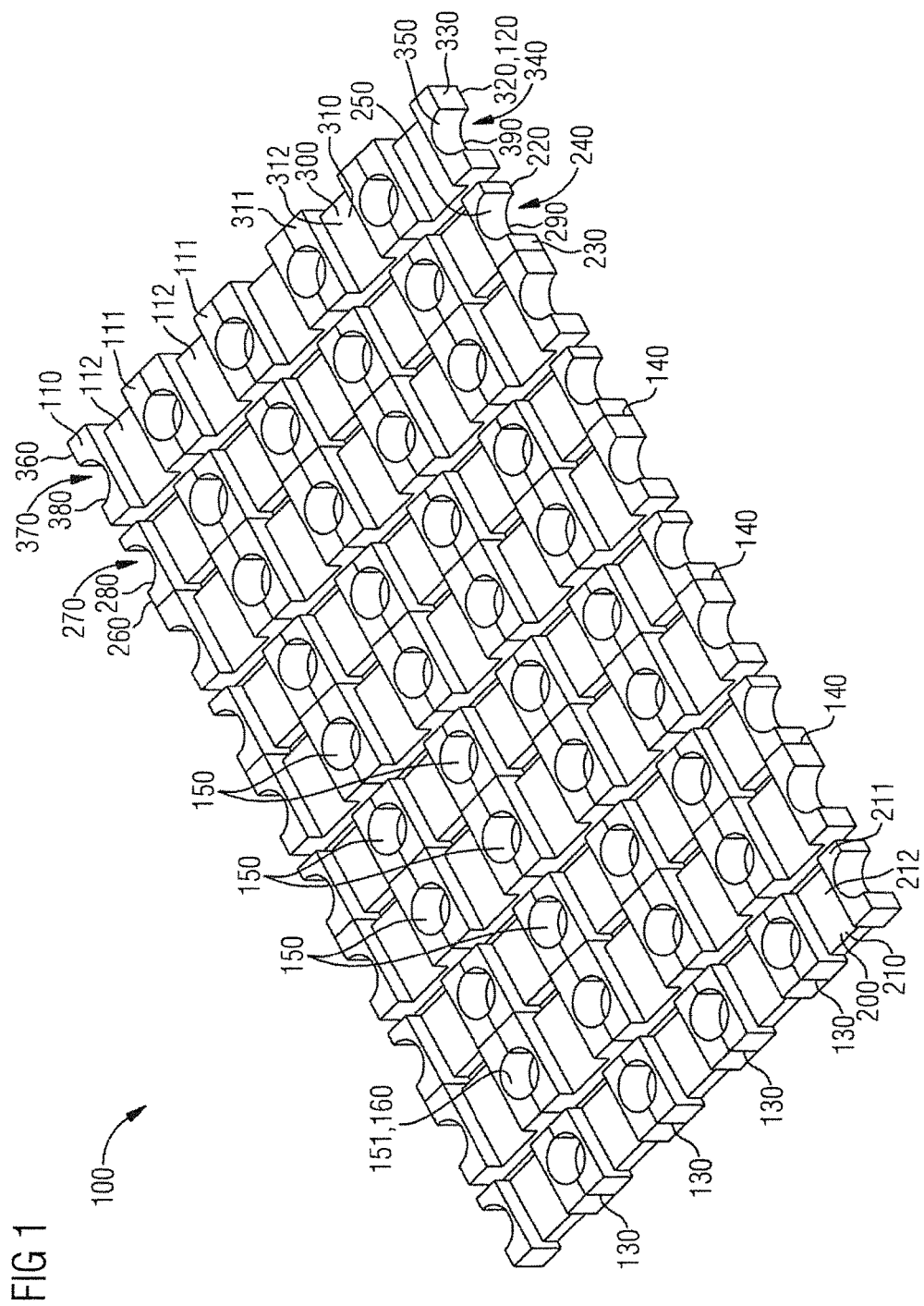
FIG. 1 schematically shows a perspective view of a lead frame having a multiplicity of first lead frame sections and second lead frame sections.

LIST OF REFERENCES 10 optoelectronic component
20 optoelectronic component
30 optoelectronic component
40 optoelectronic component
50 optoelectronic component
100 lead frame
110 upper side
111 elevated region
112 depressed region
120 lower side
130 horizontal separating plane
140 vertical separating plane
150 through-opening
151 wall
160 solderable coating 200 first lead frame section
210 upper side
211 elevated region
212 depressed region
220 lower side
230 first side flank
240 recess
250 first lateral solder contact surface
260 second side flank
270 recess
280 third lateral solder contact surface
290 first lower solder contact surface
300 second lead frame section
310 upper side
311 elevated region
312 depressed region
320 lower side
330 first side flank
340 recess
350 second lateral solder contact surface
360 second side flank
370 recess
380 fourth lateral solder contact surface
390 second lower solder contact surface
400 optoelectronic semiconductor chip
410 upper side
420 lower side
500 molded body
510 upper side
520 lower side
530 first side flank
560 second side flank
600 wavelength-converting coating
700 circuit board
1100 lead frame
1200 first lead frame section
1300 second lead frame section
1500 molded body
2100 lead frame
2200 first lead frame section
2300 second lead frame section
3200 first lead frame section
3300 second lead frame section
4200 first lead frame section
4300 second lead frame section
4350 further lead frame section
4400 further optoelectronic semiconductor chip
4500 molded body

DETAILED DESCRIPTION

Our optoelectronic component comprises a first lead frame section and a second lead frame section spaced apart from one another. The optoelectronic component furthermore comprises an optoelectronic semiconductor chip arranged on the first lead frame section and the second lead frame section. The first lead frame section and the second lead frame section in this case respectively have an upper side, a lower side and a first side flank extending between the upper side and the lower side. A first lateral solder contact surface of the optoelectronic component is formed on the first side flank of the first lead frame section.

The optoelectronic semiconductor chip of the optoelectronic component may, for example, be a light-emitting diode chip (LED chip). The first lateral solder contact surface, formed on the first side flank of the first lead frame section of the optoelectronic component, permits an arrangement of the optoelectronic component in which a radiation-emitting upper side of the optoelectronic semiconductor chip is oriented perpendicularly to a mounting plane of the optoelectronic component so that radiation emission by the optoelectronic component takes place in a direction parallel to the mounting plane. The optoelectronic component may advantageously have extremely compact dimensions and be produced in a simple and economical way. A second lateral solder contact surface of the optoelectronic component may be formed on the first side flank of the second lead frame section.

The first lateral solder contact surface may be formed by a recess arranged on the first side flank of the first lead frame section and extending from the upper side to the lower side of the first lead frame section. Correspondingly, a second lateral solder contact surface extends from the upper side to the lower side of the second lead frame section and may also be formed by a recess arranged on the first side flank of the second lead frame section. In the region of the recesses, the first side flanks of the first lead frame section and the second lead frame section may have solderable coatings.

Formation of the lateral solder contact surfaces by recesses arranged on the first side flanks advantageously allows simple control of a quality of solder connections formed between the lateral solder contact surfaces of the optoelectronic component and the associated solder contact surfaces of a circuit board, or of another carrier. The recesses arranged on the first side flanks of the first lead frame section and the second lead frame section are thus additionally used as solder monitoring structures in this case.

Owing to the fact that the recesses arranged on the first side flanks of the lead frame sections respectively extend from the upper side to the lower side of the lead frame sections, the lateral solder contact surfaces, formed by the recesses, of the optoelectronic component allow autonomous alignment of the optoelectronic component during a soldering process for electrical contacting of the optoelectronic component. The lateral solder contact surfaces, formed by the recesses, of the optoelectronic component are also used as solder alignment structures in this case.

The first lead frame section and the second lead frame section respectively may have a second side flank lying opposite the first side flank. A third lateral solder contact surface of the optoelectronic component may in this case be formed on the second side flank of the first lead frame section. Correspondingly, a fourth lateral solder contact surface of the optoelectronic component may also be formed on the second side flank of the second lead frame section. The third lateral solder contact surface, formed on the second side flank of the first lead frame section, allows mounting of the optoelectronic component in an orientation in which the second side flanks of the first lead frame section and of the second lead frame section of the optoelectronic component face toward a mounting surface. In this way, the optoelectronic component is advantageously particularly flexibly usable.

The optoelectronic semiconductor chip may be arranged closer to the first side flank than to the second side flank of the lead frame section. In a mounting orientation of the optoelectronic component in which the first side flanks of the lead frame sections face toward a mounting carrier, the optoelectronic semiconductor chip of the optoelectronic component is therefore arranged especially close to the mounting side of the mounting carrier.

A first lower solder contact surface of the optoelectronic component may be formed on the lower side of first lead frame section. Correspondingly, a second lower solder contact surface of the optoelectronic component may also be arranged on the lower side of the second lead frame section of the optoelectronic component. Advantageously, the optoelectronic component therefore also allows mounting of the optoelectronic component in an orientation in which the lower sides of the lead frame sections of the optoelectronic component face toward a mounting surface of the mounting carrier. In this orientation, a radiation-emitting upper side of the optoelectronic semiconductor chip of the optoelectronic component may be oriented parallel to the mounting surface of the mounting carrier so that light emission by the optoelectronic semiconductor chip of the optoelectronic component takes place in a direction perpendicular to the mounting surface of the mounting carrier. In this way, the optoelectronic component is advantageously particularly flexibly usable.

The optoelectronic component may have no further supporting housing parts apart from the first lead frame section and the second lead frame section. The first lead frame section and the second lead frame section may in this case connect to one another mechanically stably by the optoelectronic semiconductor chip of the optoelectronic component. Advantageously, a particularly simple and compact structure of the optoelectronic component is in this case obtained.

The first lead frame section and the second lead frame section may be embedded together in a molded body. Embedding the first lead frame section and the second lead frame section in the molded body may, for example, be carried out by a molding process. The molded body may ensure mechanically stable connection of the lead frame sections of the optoelectronic component to one another so that a very compact housing is formed. Advantageously, it is therefore not necessary to configure the optoelectronic component with further supporting housing parts. This allows the optoelectronic component to be configured with very compact external dimensions and produced in a simple and economical way.

The lower side of the first lead frame section and the lower side of the second lead frame section may be flush with a lower side of the molded body. Advantageously, this leads to particularly compact external dimensions of the optoelectronic component. If a first lower solder contact surface is formed on the lower side of the first lead frame section then the optoelectronic component may advantageously be suitable as an SMT component for surface mounting.

The first side flank of the first lead frame section and the first side flank of the second lead frame section may be flush with a first side flank of the molded body. Advantageously, the optoelectronic component may therefore have compact external dimensions. The first lateral solder contact surface, exposed on the first side flank of the first lead frame section, of the optoelectronic component allows SMT mounting of the optoelectronic component by a surface mounting method.

At least a part of the upper side of the first lead frame section and at least a part of the upper side of the second lead frame section may be flush with an upper side of the molded body. Advantageously, particularly compact external dimensions of the optoelectronic component are obtained in this way.

The optoelectronic semiconductor chip may be arranged over the upper side of the molded body. The optoelectronic semiconductor chip may in this case, for example, be configured as a volume-emitting semiconductor chip. The upper side of the molded body and/or the upper sides of the lead frame sections embedded in the molded body may be used as a reflector for electromagnetic radiation emitted by the optoelectronic semiconductor chip in the direction of the upper side of the molded body. Advantageously, this optoelectronic component may be formed with particularly small external dimensions. The optoelectronic semiconductor chip may in this case be arranged particularly close to a mounting surface of a mounting carrier supporting the optoelectronic component.

The optoelectronic semiconductor chip may be embedded in the molded body. An upper side of the optoelectronic semiconductor chip is in this case flush with the upper side of the molded body. The upper side of the optoelectronic semiconductor chip in this case forms a radiation emission surface of the optoelectronic semiconductor chip. Advantageously, the optoelectronic semiconductor chip of this optoelectronic component is protected against damage by external effects by its embedding in the molded body.

The optoelectronic semiconductor chip may be configured as a volume-emitting sapphire flip chip. Advantageously, the optoelectronic component therefore allows emission of light in a large solid angle range.

The optoelectronic component may have a further lead frame section spaced apart from the first lead frame section and the second lead frame section. A further optoelectronic semiconductor chip is in this case arranged on the second lead frame section and on the further lead frame section.

A second lateral solder contact surface of the optoelectronic component may be formed on a first side flank of the further lead frame section. Correspondingly, a fourth lateral solder contact surface of the optoelectronic component may be formed on a second side flank, lying opposite the first side flank, of the further lead frame section. Furthermore, a second lower solder contact surface of the optoelectronic component may be formed on the lower side of the further lead frame section of the optoelectronic component. The second lead frame section of the optoelectronic component does not need to have solder contact surfaces in this example. It is, however, also possible for solder contact surfaces to be provided on the second lead frame section of the optoelectronic component. These may, for example, remain uncontacted during mounting of the optoelectronic component.

It is likewise possible to configure the optoelectronic component with yet other lead frame sections and yet other optoelectronic semiconductor chips. The individual optoelectronic semiconductor chips of the optoelectronic component may in this case be arranged linearly behind one another in the form of a chain. Such chains of different length may in this case be produced simultaneously in common production steps. The optoelectronic component comprising a multiplicity of optoelectronic semiconductor chips in a linear arrangement may, for example, be used for lateral backlighting of liquid-crystal display screens.

A method of producing an optoelectronic component comprises steps of providing a lead frame having an upper side and a lower side, the lead frame comprising a first lead frame section and a second lead frame section, arranging an optoelectronic semiconductor chip on the first lead frame section and on the second lead frame section, and dividing the lead frame to individualize the optoelectronic component, a first side flank extending from the upper side to the lower side respectively being formed by the division at the first lead frame section and at the second lead frame section on a separating plane, a first lateral solder contact surface being formed on the first side flank of the first lead frame section. Correspondingly, a second lateral solder contact surface of the optoelectronic component may be formed on the first side flank of the second lead frame section.

Advantageously, this method allows simple and economical production of an optoelectronic component with very compact external dimensions. The lateral solder contact surfaces formed on the side flanks of the lead frame sections of the optoelectronic component allow mounting of the optoelectronic component obtainable by the method in a side-looker arrangement, in which the optoelectronic component emits electromagnetic radiation in a direction parallel to the mounting surface.

The method may comprise a further step of embedding the first lead frame section and the second lead frame section in a molded body. The molded body may connect the first lead frame section and the second lead frame section of the optoelectronic component obtainable by the method to one another in a mechanically robust way. Further supporting housing components do not need to be provided in this case so that compact external dimensions of the optoelectronic component obtainable by the method may be obtained.

The method may comprise a further step of forming a through-opening, extending from the upper side to the lower side, in the lead frame, the separating plane extending through the through-opening during the division of the lead frame, the first lateral solder contact surface being formed by a wall of the through-opening. Advantageously, a recess in the first side flank formed on the separating plane and forming the first lateral solder contact surface, of the first lead frame section is obtained during division of the lead frame on the separating plane in the region of the through-opening. This recess may in addition also be used as a solder monitoring structure and as a solder alignment structure in the optoelectronic component obtainable by the method.

The method may comprise a further step of arranging a solderable coating on the wall of the through-opening. Advantageously, the recess, forming the first lateral solder contact surface, on the first side flank of the first lead frame section then likewise has the solderable coating so that electrical contacting of the optoelectronic component obtainable by the method by a soldering method is made possible.

The method may comprise a further step of applying a wavelength-converting coating onto the optoelectronic semiconductor chip by a spray method. The wavelength-converting coating may be used to convert electromagnetic radiation emitted by the optoelectronic semiconductor chip of the optoelectronic component obtainable by the method at least partially into electromagnetic radiation of another wavelength. In this way, for example, light with a wavelength in the blue or ultraviolet spectral range may be converted into light which has a white color impression.

A method of producing an optoelectronic arrangement comprises steps of producing an optoelectronic component by a method of the type mentioned above, and arranging the optoelectronic component on a circuit board, the first side flanks of the first lead frame section and the second lead frame section facing toward the circuit board. Advantageously, emission of light in a direction parallel to the circuit board takes place in the optoelectronic arrangement obtainable by this method. The radiation emission may in this case advantageously take place at a short distance from the circuit board. The entire optoelectronic arrangement obtainable by the method may advantageously have very compact external dimensions.

The above-described properties, features and advantages, as well as the way in which they are achieved, will become more clearly and readily comprehensible in conjunction with the following description of examples, which will be explained in more detail in connection with the drawings.

FIG. 1 shows a schematic perspective representation of a part of the lead frame 100. The lead frame 100 has an essentially flat and planar shape and may, for example, be produced from a thin metal sheet by etching and/or stamping. The lead frame 100 consists of an electrically conductive material, preferably a metal.

The lead frame 100 has an upper side 110 and a lower side 120, lying opposite the upper side 110. The upper side 110 has elevated regions 111 and regions 112 depressed relative to the elevated regions 111. The depressed regions 112 may, for example, be formed by removing part of the material of the lead frame 100 on the upper side 110.

The lead frame 100 has a multiplicity of first lead frame sections 200, all of which are configured identically to one another. Furthermore, the lead frame 100 has a multiplicity of second lead frame sections 300, all of which are likewise configured identically to one another.

Figure 2:
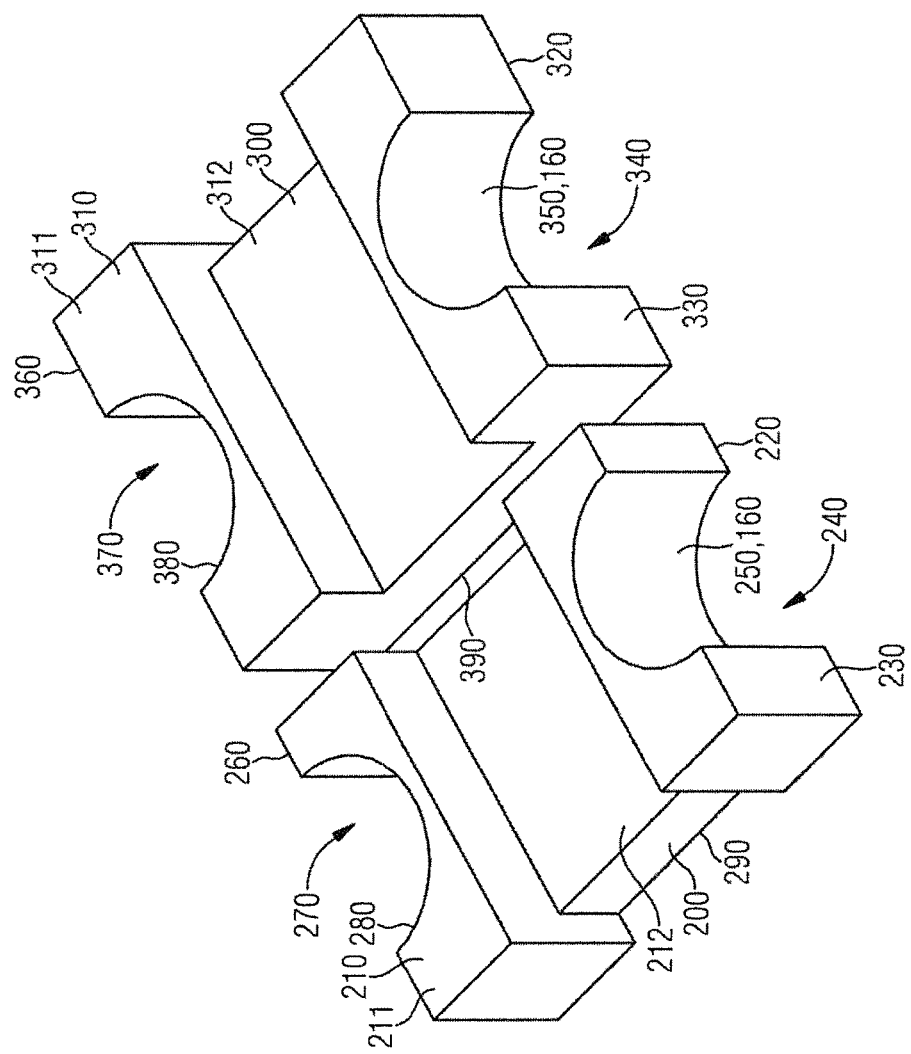
FIG. 2 schematically shows a perspective view of a first lead frame section and a second lead frame section of the lead frame.

In each case, a first lead frame section 200 and a second lead frame section 300 form an associated pair. FIG. 2 shows a schematic representation of such a pair of a first lead frame section 200 and a second lead frame section 300. The first lead frame section 200 and the second lead frame section 300 of an associated pair are not connected directly to one another. On the panel of the lead frame 100, however, all the lead frame sections 200, 300 connect to one another by further neighboring lead frame sections 200, 300 and an edge (shown in FIG. 1) of the lead frame 100.

The associated pairs of first lead frame sections 200 and second lead frame sections 300 may be individualized by dividing the lead frame 100 on horizontal separating planes 130 and on vertical separating planes 140. The horizontal separating planes 130 and the vertical separating planes 140 are in this case oriented perpendicularly to the upper side 110 and the lower side 120 of the lead frame 100.

Each first lead frame section 200 has an upper side 210 and a lower side 220 lying opposite the upper side 210. The upper side 210 and the lower side 220 are formed by sections of the upper side 110 and of the lower side 120 of the lead frame 100. The upper side 210 of each first lead frame section 200 has elevated regions 211 and regions 212 depressed relative to the elevated regions 211. Correspondingly, each second lead frame section 300 of the lead frame 100 also has an upper side 310 and a lower side 320 lying opposite the upper side 310, the upper side 310 having depressed regions 312 and regions 311 depressed relative to the depressed regions 312.

The depressed regions 212, 312 on the upper sides 210, 310 of the first lead frame sections 200 and of the second lead frame sections 300 are respectively configured as trenches arranged between elevated regions 211, 311. In this case, the trenches on the upper side 210 of a first lead frame section 200 and the trenches on the upper side 310 of the second lead frame section 300 associated with the first lead frame section 200 are arranged collinearly such that the two trenches continue one another.

The lead frame 100 has through-openings 150 extending from the upper side 110 to the lower side 120 of the lead frame 100. The through-openings 150 may respectively have an approximately cylindrical shape, for example, an approximately circular-cylindrical shape. The through-openings 150 may, for example, be formed by an etching process.

A solderable coating 160 may be arranged on the inner walls 151 of the through-openings 150. The solderable coating 160 may be referred to as plating, and preferably comprises an electrically conductive metal that can be wetted well by a solder. The solderable coating 160 may also extend over other regions of the upper side 110 and/or of the lower side 120 of the lead frame 100.

The through-openings 150 and the solderable coating 160 arranged on the walls 151 of the through-openings 150 are formed before division of the lead frame 100 along the horizontal separating planes 130 and the vertical separating planes 140.

By division of the lead frame 100 on the horizontal separating planes 130 a first side flank 230 extending between the upper side 210 and the lower side 220 of the respective first lead frame section 200 is formed on each first lead frame section 200 on a first horizontal separating plane 130. A second side flank 260 extending from the upper side 210 to the lower side 220 of the respective first lead frame section 200 and lying opposite the first side flank 230 is formed on a second horizontal separating plane 130. Correspondingly, a first side flank 330 and a second side flank 360 lying opposite the first side flank 330, which respectively extend from the upper side 310 of the respective second lead frame section 300 to the lower side 320 of the respective second lead frame section 300, are also formed on each second lead frame section 300.

The horizontal separating planes 130 provided for division of the lead frame 100 to individualize the pairs of first lead frame sections 200 and the second lead frame sections 300 extend through the through-openings 150 in the lead frame 110. The through-openings 150 separated by division of the lead frame 100 on the horizontal separating planes 130 form recesses in the side flanks 230, 260, 330, 360, formed during division of the lead frame 100, of the lead frame sections 200, 300. The first side flank 230 of each first lead frame section 200 has a recess 240. The second side flank 260 of each first lead frame section 200 has a recess 270. The first side flank 330 of each second lead frame section 300 has a recess 340. The second side flank 360 of each second lead frame section 300 has a recess 370. The recesses 240, 270, 340, 370 respectively extend from the elevated regions 211, 311 of the upper sides 210, 310 of the lead frame sections 200, 300 to the lower sides 220, 320 of the lead frame sections 200, 300.

The side flanks 230, 260, 330, 360, formed during division of the lead frame 100, of the lead frame sections 200, 300 have the solderable coating 160 only in the region of the recesses 240, 270, 340, 370 formed by the walls 151 of the through-openings 150. The recess 240 on the first side flank 230 of each first lead frame section 200 therefore forms a first lateral solder contact surface 250 of this first lead frame section 200. The recess 270 on the second side flank 260 of each first lead frame section 200 forms a third lateral solder contact surface 280. The recess 340 on the first side flank 330 of each second lead frame section 200 forms a second lateral solder contact surface 350. The recess 370 on the second side flank 360 of each second lead frame section 300 forms a fourth lateral solder contact surface 380.

Figure 3:
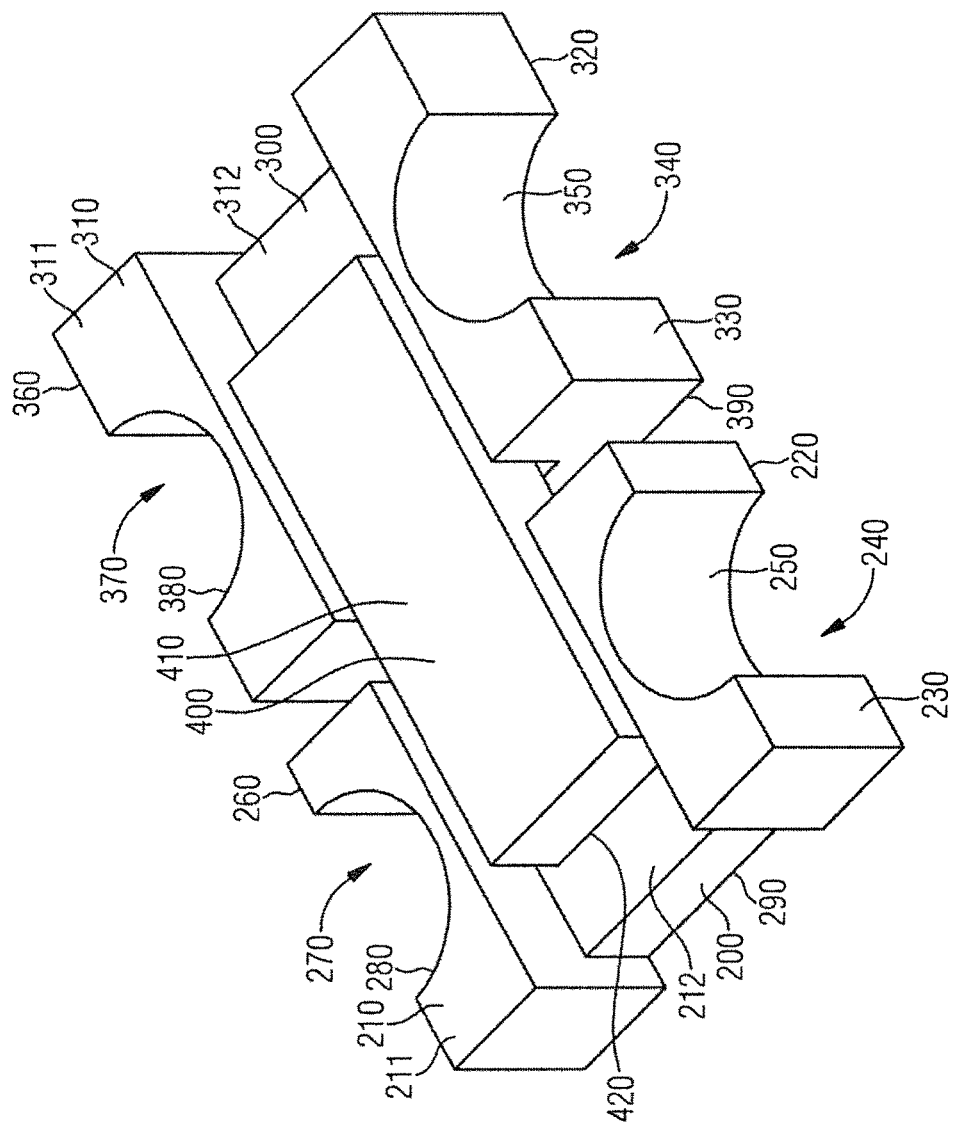
FIG. 3 schematically shows a perspective view of the lead frame sections with and optoelectronic semiconductor chip arranged thereon.

FIG. 3 shows another perspective representation of the pair shown in FIG. 2 of a first lead frame section 200 and a second lead frame section 300. In the representation of FIG. 3, an optoelectronic semiconductor chip 400 is arranged on the first lead frame section 200 and on the second lead frame section 300.

Arrangement of the optoelectronic semiconductor chips 400 is carried out before division of the lead frame 100 along the horizontal separating planes 130 and the vertical separating planes 140. In this case, one optoelectronic semiconductor chip 400 is respectively arranged on each pair of a first lead frame section 200 and a second lead frame section 300.

The optoelectronic semiconductor chip 400 may, for example, be configured as a light-emitting diode chip (LED chip). The optoelectronic semiconductor chip 400 has an upper side 410 and a lower side 420 lying opposite the upper side 410. The optoelectronic semiconductor chip 400 is configured to emit electromagnetic radiation on its upper side 410. The upper side 410 therefore forms a radiation emission surface of the optoelectronic semiconductor chip 400. The optoelectronic semiconductor chip 400 may also be configured to emit electromagnetic radiation on other surfaces.

The optoelectronic semiconductor chip 400 is arranged in the trench formed by the depressed regions 212, 312 on the upper sides 210, 310 of the lead frame sections 200, 300. In this case, the lower side 420 of the optoelectronic semiconductor chip 400 faces toward the upper sides 210, 310 of the lead frame sections 200, 300. The optoelectronic semiconductor chip 400, therefore, contacts both the first lead frame section 200 and the second lead frame section 300, and bridges the distance lying between the first lead frame section 200 and the second lead frame section 300. The lower side 420 of the optoelectronic semiconductor chip 400 may, for example, connect to the first lead frame section 200 and the second lead frame section 300 by a solder connection or an adhesive bond.

Preferably, the thickness of the optoelectronic semiconductor chip 400 as measured between its upper side 410 and its lower side 420 corresponds approximately to the depth of the depressed regions 212, 312 of the lead frame sections 200, 300 so that the upper side of the optoelectronic semiconductor chip 400 lies approximately at the same height as the elevated regions 211, 311 of the lead frame sections 200, 300.

The optoelectronic semiconductor chip 400 electrically conductively connects to the first lead frame section 200 and the second lead frame section 300. To this end, for example, electrical contacts of the optoelectronic semiconductor chip 400 may be formed on the lower side 420 of the optoelectronic semiconductor chip 400, these contacts being electrically conductively connected by solder connections to the first lead frame section 200 and to the second lead frame section 300. As an alternative, however, electrical contacts of the optoelectronic semiconductor chip 400 may also electrically conductively connect to the lead frame sections 200, 300 by bond connections (not shown in FIG. 3).

Figure 4:
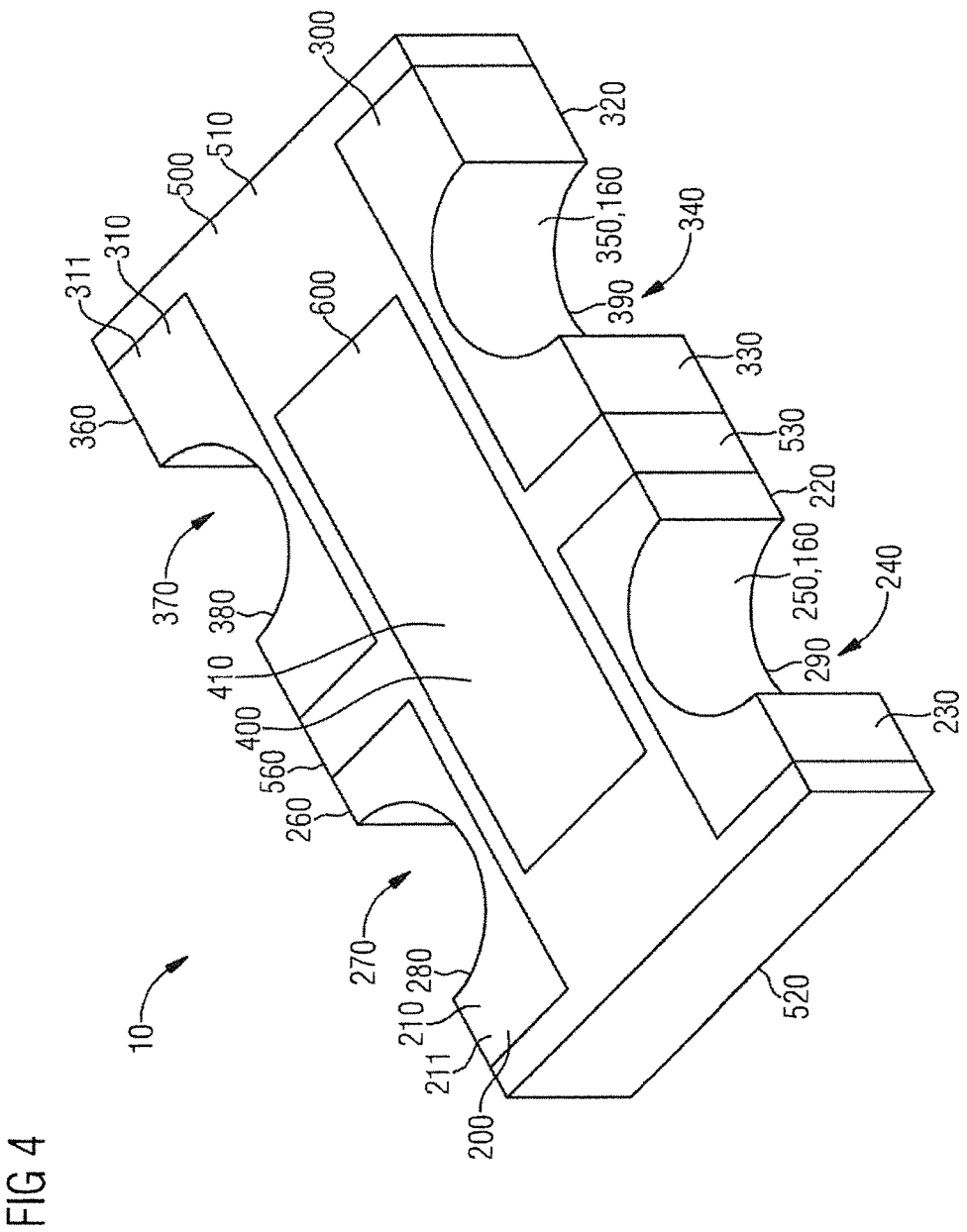
FIG. 4 schematically shows a perspective view of an optoelectronic component formed from the lead frame sections and the optoelectronic semiconductor chip.

FIG. 4 shows a schematic perspective representation of the first lead frame section 200 and the second lead frame section 300 of FIG. 3 in a representation of the processing state chronologically following the representation of FIG. 3. The first lead frame section 200, the second lead frame section 300 and the optoelectronic semiconductor chip 400 arranged on the first lead frame section 200 and the second lead frame section 300 have been embedded together in a molded body 500. An optoelectronic component 10 has in this way been formed.

The molded body 500 comprises an electrically insulating molding material, for example, an epoxy resin. The molded body 500 may, for example, be produced by compression molding or transfer molding, in particular by film-assisted transfer molding. The molded body 500 may also be produced by another molding method.

The molded body 500 is formed before division of the lead frame 300 along the horizontal separating planes 130 and the vertical separating planes 140. In this case, all the first lead frame sections 200 and second lead frame sections 300 and the optoelectronic semiconductor chips 400 arranged thereon are embedded in a common molded body. Subsequently, the molded body together with the lead frame 100 is divided along the horizontal separating planes 130 and the vertical separating planes 140.

The molded body 500 has an upper side 510 and a lower side 520 lying opposite the upper side 510. A first side flank 530 of the molded body 500 and a second side flank 560, lying opposite the first side flank 530, extend between the upper side 510 and the lower side 520. The first side flank 530 and the second side flank 560 have been formed by the division of the original large molded body and the lead frame 100 embedded therein on the horizontal separating planes 130.

On the first side flank 530 of the molded body 500, the first side flank 230 of the first lead frame section 200 and the first side flank 330 of the second lead frame section 300 are exposed. The first lateral solder contact surface 250 and the second lateral solder contact surface 350 are therefore accessible on the first side flank 530 of the molded body 500. The first side flank 230 of the first lead frame section 200 and the first side flank 330 of the second lead frame section 300 are flush with the first side flank 530 of the molded body 500. Correspondingly, the second side flank 260 of the first lead frame section 200 and the second side flank 360 of the second lead frame section 300 are also exposed on the second side flank 560 of the molded body 500 and flush with the second side flank 560 of the molded body 500. The third lateral contact surface 280 and the fourth lateral solder contact surface 380 of the optoelectronic component 10 are therefore accessible on the second side flank 560 of the molded body 500.

The elevated regions 211, 311 of the upper sides 210, 310 of the first lead frame section 200 and of the second lead frame section 300 and the upper side 410 of the optoelectronic semiconductor chip 400 are exposed on the upper side 510 of the molded body 500 and essentially flush with the upper side 510 of the molded body 500. In this way, electromagnetic radiation emitted by the optoelectronic semiconductor chip 400 on its upper side 410 can be emitted by the optoelectronic component 10 on the upper side 510 of the molded body 500. The upper side 410 of the optoelectronic semiconductor chip 400 may, for example, be covered by a film during formation of the molded body 500 and therefore protected from being covered by the material of the molded body 500.

Preferably, the lower sides 220, 320 of the first lead frame section 200 and the second lead frame section 300 are also exposed on the lower side 520 of the molded body 500 and flush with the lower side 520 of the molded body 500. In this case, a first lower solder contact surface 290 of the optoelectronic component 10 may be formed on the lower side 220 of the first lead frame section 200, and a second lower solder contact surface 390 of the optoelectronic component 10 may be formed on the lower side 320 of the second lead frame section 300. Preferably, the first lower solder contact surface 290 and the second lower solder contact surface 390 have the solderable coating 160.

A wavelength-converting coating 600 may be arranged on the upper side 410 of the optoelectronic semiconductor chip 400 and, optionally, also in other regions on the upper side 510 of the molded body 500 and the upper sides 210, 310 of the lead frame sections 200, 300. The wavelength-converting coating 600 may be provided to convert electromagnetic radiation emit-ted by the optoelectronic semiconductor chip 400 at least partially into electromagnetic radiation of another wavelength. In this way, for example, light having a white color impression may be generated from electromagnetic radiation with a wavelength in the blue or ultraviolet spectral range. The wavelength-converting coating 600 may preferably already be applied before division of the molded body 500 and of the lead frame 100, for example, by a spray method. The wavelength-converting coating 600 may, however, also be omitted. The optoelectronic semiconductor chip 400 may also already have a wavelength-converting element arranged on its upper side 410 before the embedding of the optoelectronic semiconductor chip 400 in the molded body 500. In this case, after the embedding the optoelectronic semiconductor chip 400, the wavelength-converting element is flush with the upper side 510 of the molded body 500.

Figure 5:
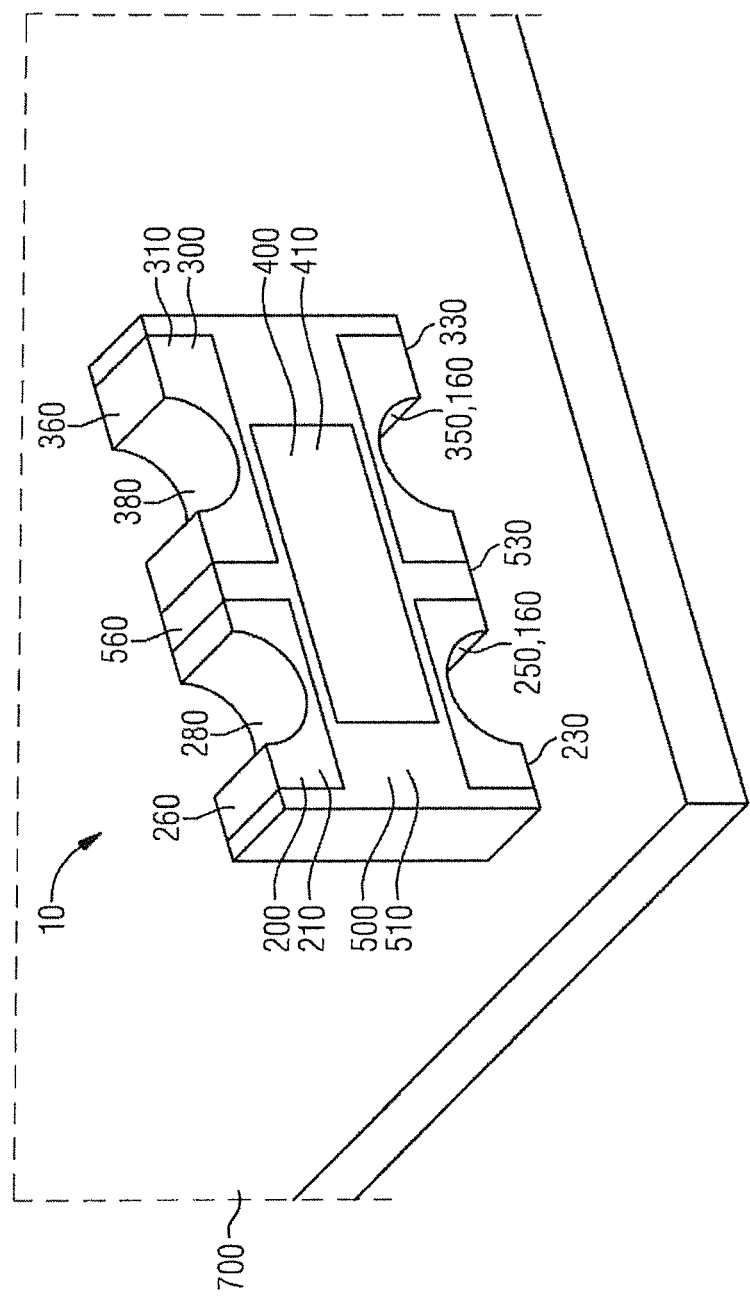
FIG. 5 schematically shows a perspective view of the optoelectronic component mounted on a circuit board.

FIG. 5 shows a schematic perspective representation of an optoelectronic arrangement consisting of a circuit board 700 and the optoelectronic component 10 arranged thereon. The circuit board 700 may, for example, be a printed circuit board (PCB) and has electrical contacts (not represented in detail in FIG. 5) on its upper side for electrical contacting of the optoelectronic component 10. Instead of the circuit board 700, another type of carrier can also be provided.

The optoelectronic component 10 is arranged on the upper side of the circuit board 700 such that the first side flank 230, 330 of the first lead frame section 200 and of the second lead frame section 300 face toward the circuit board 700. The first lateral solder contact surface 250, arranged on the first side flank 230 of the first lead frame section 200, of the optoelectronic component 10 and the second lateral solder contact surface 350, arranged on the first side flank 330 of the second lead frame section 300, of the optoelectronic component 10 electrically conductively connect by solder connections to the contact surfaces arranged on the upper side of the circuit board 700 although this is not represented in detail in FIG. 5.

The recesses 240, 340, forming the lateral solder contact surfaces 250, 350, on the first side flanks 230, 330 of the lead frame sections 200, 300 may be used as solder monitoring structures which allow optical inspection of the quality of the solder connections between the lateral solder contact surfaces 250, 350 of the optoelectronic component 10 and the contact surfaces of the circuit board 700. Preferably, the recesses 240, 340 are fully closed by the solder during the production of the solder connections so that it is no longer possible to see through the recesses 240, 340.

Since the recesses 240, 340 forming the lateral solder contact surfaces 250, 350 respectively extend symmetrically from the upper sides 210, 310 to the lower sides 220, 320 over the entire height of the side flanks 230, 330 of the lead frame sections 200, 300 of the optoelectronic component 10, the recesses 240, 340 forming the lateral solder contact surfaces 250, 350 may be used as solder alignment structures to align the optoelectronic component 10 on the upper side of the circuit board 700. Wetting the lateral solder contact surfaces 250, 350, obtained during production of the solder connection between the lateral solder contact surfaces 250, 350 of the optoelectronic component 10 and the contact surfaces of the circuit board 700, may lead to alignment of the inclination and/or the position of the optoelectronic component 10 on the upper side of the circuit board 700.

Owing to the fact that the first side flanks 230, 330 of the lead frame sections 200, 300 of the optoelectronic component 10 in the optoelectronic arrangement of FIG. 5 face toward the upper side of the circuit board 700, the upper side 410 of the optoelectronic semiconductor chip 400 of the optoelectronic component 10 is oriented perpendicularly to the upper side of the circuit board 700. Emission of electromagnetic radiation by the optoelectronic component 10 takes place in a direction parallel to the upper side of the circuit board 700. The optoelectronic component 10 is therefore in a side-looker arrangement.

As an alternative to the arrangement of the optoelectronic component 10 represented in FIG. 5, it is also possible to arrange the optoelectronic component 10 on the upper side of the circuit board 700 such that the second side flank 260 of the first lead frame section 200 and the second side flank 360 of the second lead frame section 300 of the optoelectronic component 10 face toward the upper side of the circuit board 700. The optoelectronic component 10 will in this case be electrically contacted by the third lateral solder contact surface 280 and the fourth lateral solder contact surface 380. In this case as well, the optoelectronic component 10 is in a side-looker arrangement.

A further possibility consists in arranging the optoelectronic component 10 on the circuit board 700 such that the lower side 220 of the first lead frame section 200 and the lower side 320 of the second lead frame section 300 of the optoelectronic component 10 face toward the upper side of the circuit board 700. In this case, the optoelectronic component 10 will be electrically contacted by the first lower solder contact surface 290 on the lower side 220 of the first lead frame section 200 and by the second lower solder contact surface 390 on the lower side 320 of the second lead frame section 300. In this arrangement of the optoelectronic component 10, the upper side 410 of the optoelectronic semiconductor chip 400 of the optoelectronic component 10 is oriented parallel to the upper side of the circuit board 700. Emission of electromagnetic radiation by the optoelectronic component 10 takes place in a direction perpendicular to the upper side of the circuit board 700. The optoelectronic component 10 is therefore in a top-looker arrangement.

Figure 6:
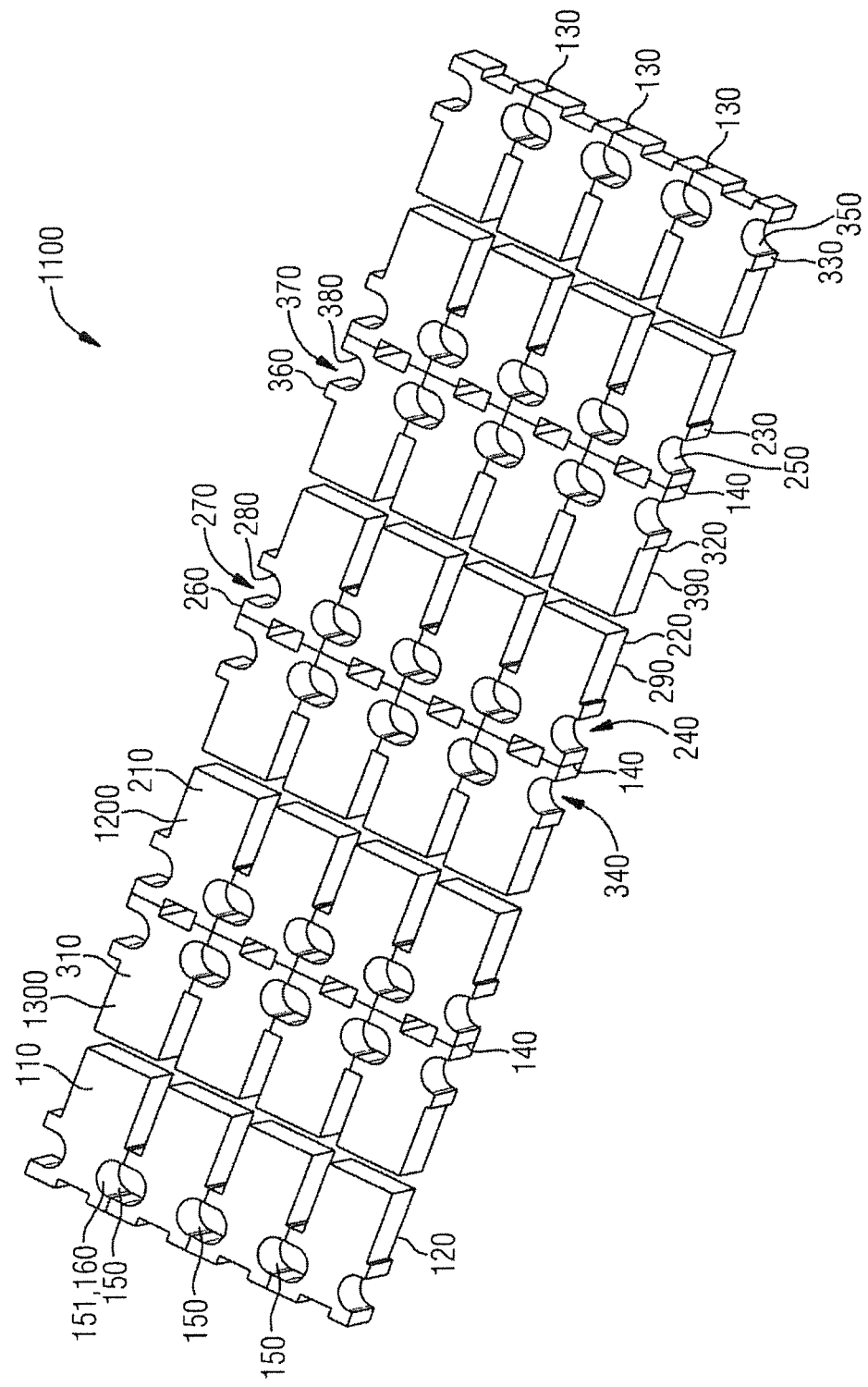
FIG. 6 schematically shows a perspective view of a lead frame according to another example.

FIG. 6 shows a schematic perspective representation of a lead frame 1100 according to an alternative example. The lead frame 1100 has a multiplicity of first lead frame sections 1200 and second lead frame sections 1300. The lead frame 1100 and its first lead frame sections 1200 and second lead frame sections 1300 essentially correspond in shape and function to the lead frame 100 represented in FIG. 1 with the first lead frame sections 200 and the second lead frame sections 300. Components of the lead frame 1100 corresponding to components present in the lead frame 100 are therefore provided with the same references in FIG. 6 as in FIG. 1, and will not be described again in detail below. The rest of the description is limited to a presentation of the differences between the lead frame 1100 and the lead frame 100.

Figure 7:
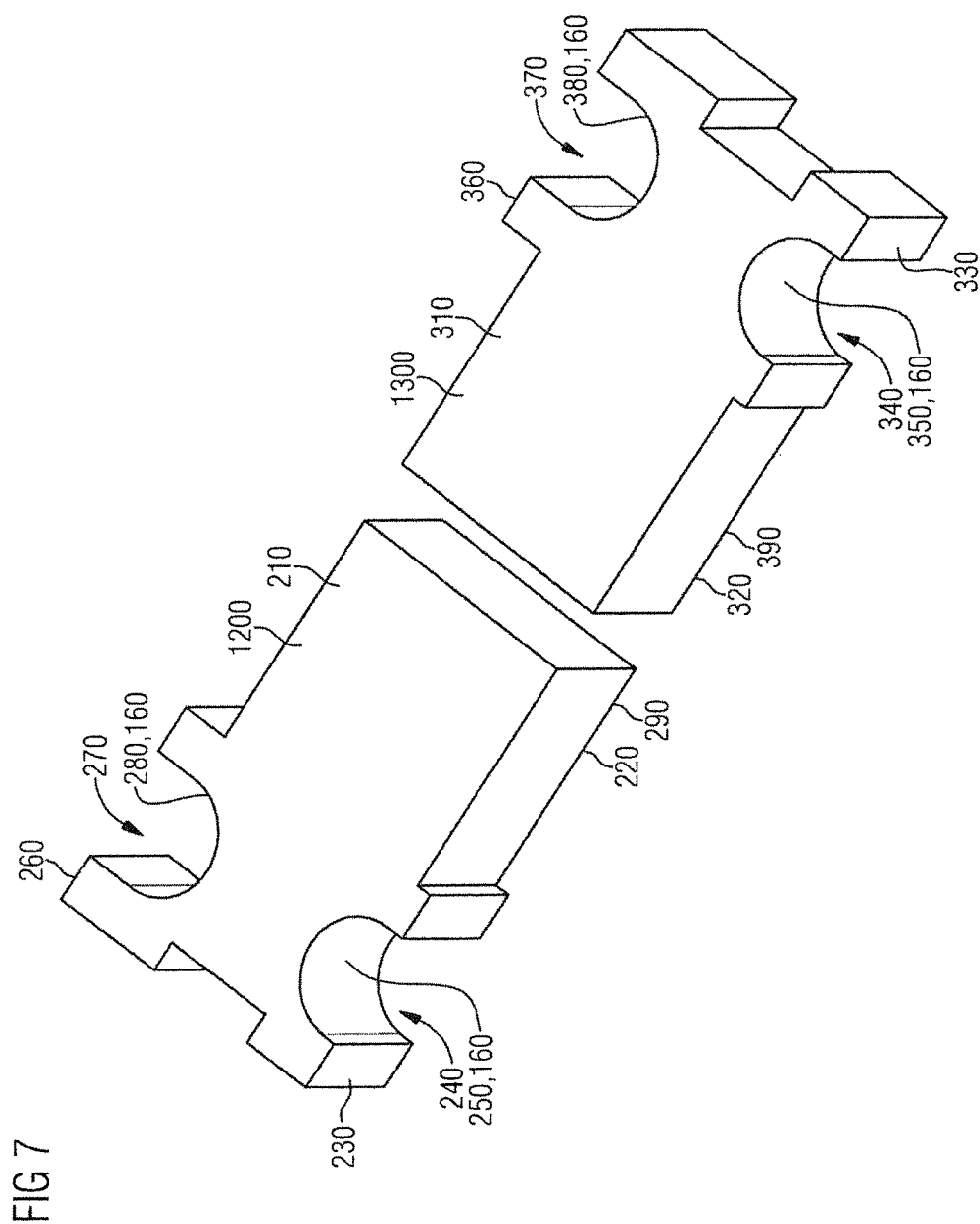
FIG. 7 schematically shows a perspective view of a first lead frame section and a second lead frame section of this lead frame.

FIG. 7 shows a schematic perspective representation of a pair of a first lead frame section 1200 and a second lead frame section 1300 of the lead frame 1100. The lead frame sections 1200, 1300 of the lead frame 1100 differ from the lead frame sections 200, 300 of the lead frame 100 essentially in that the upper sides 210, 310 of the lead frame sections 1200, 1300 are not subdivided into elevated regions and depressed regions. Instead, the entire upper sides 210, 310 of the lead frame sections 1200, 1300 of the lead frame 1100 are essentially configured to be planar.

Figure 8:
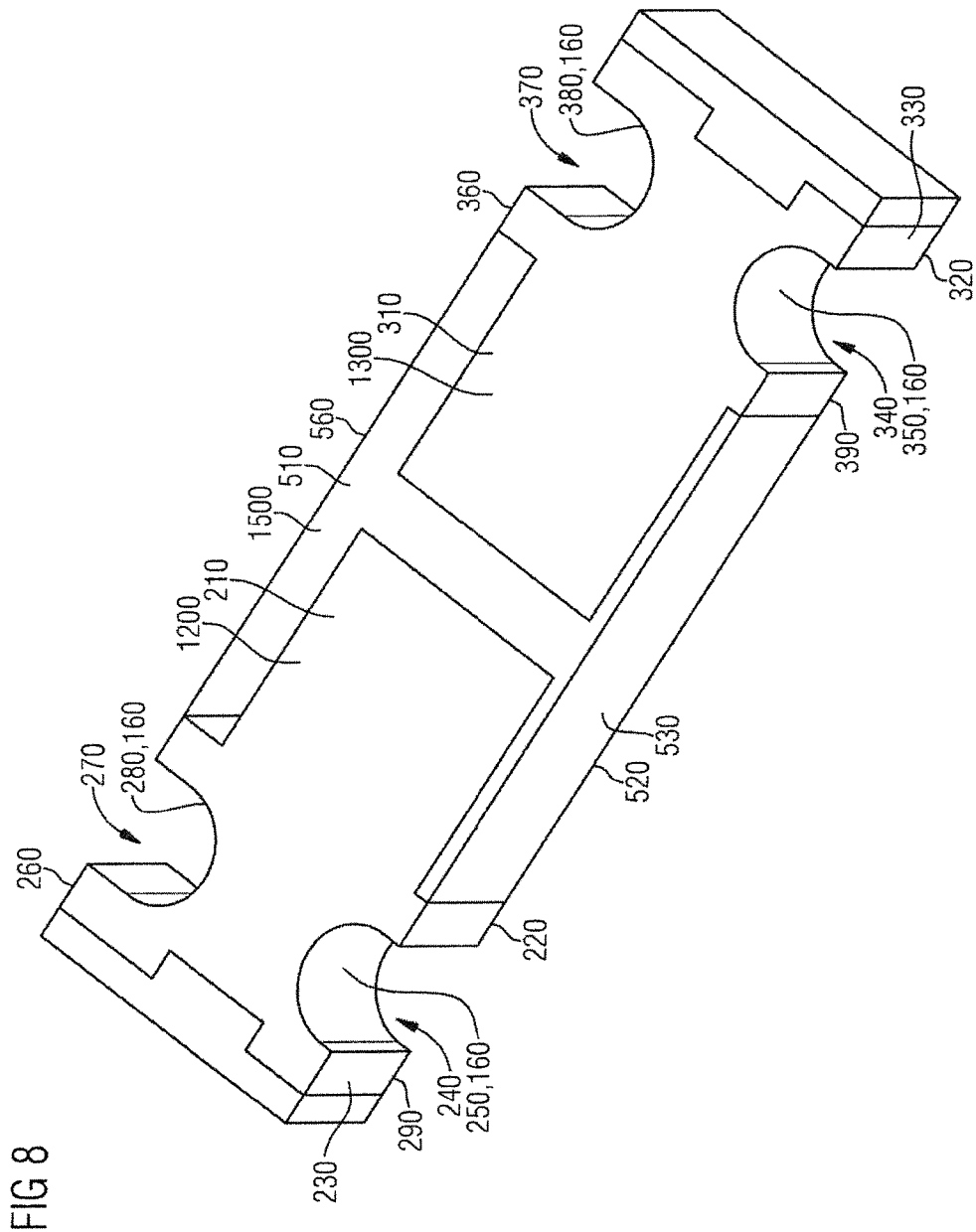
FIG. 8 schematically shows the first lead frame section and the second lead frame section after embedding in a molded body.

FIG. 8 shows a schematic perspective representation of the first lead frame section 1200 and of the second lead frame section 1300 in a processing state chronologically following the representation of FIG. 7. The first lead frame section 1200 and the second lead frame section 1300 have been embedded in a molded body 1500 configured in essentially the same way as the molded body 500 of FIG. 4.

All the first lead frame sections 1200 and second lead frame sections 1300 of the lead frame 1100 are embedded before the division of the lead frame 1100 in a common large molded body, which is divided in a subsequent method step, together with the lead frame 1100, on the horizontal separating planes 130 and the vertical separating planes 140.

The upper sides 210, 310 of the first lead frame section 1200 and of the second lead frame section 1300 are exposed on the upper side 510 of the molded body 1500 and are flush with the upper side 510 of the molded body 1500. An optoelectronic semiconductor chip is not embedded in the molded body 1500.

Figure 9:
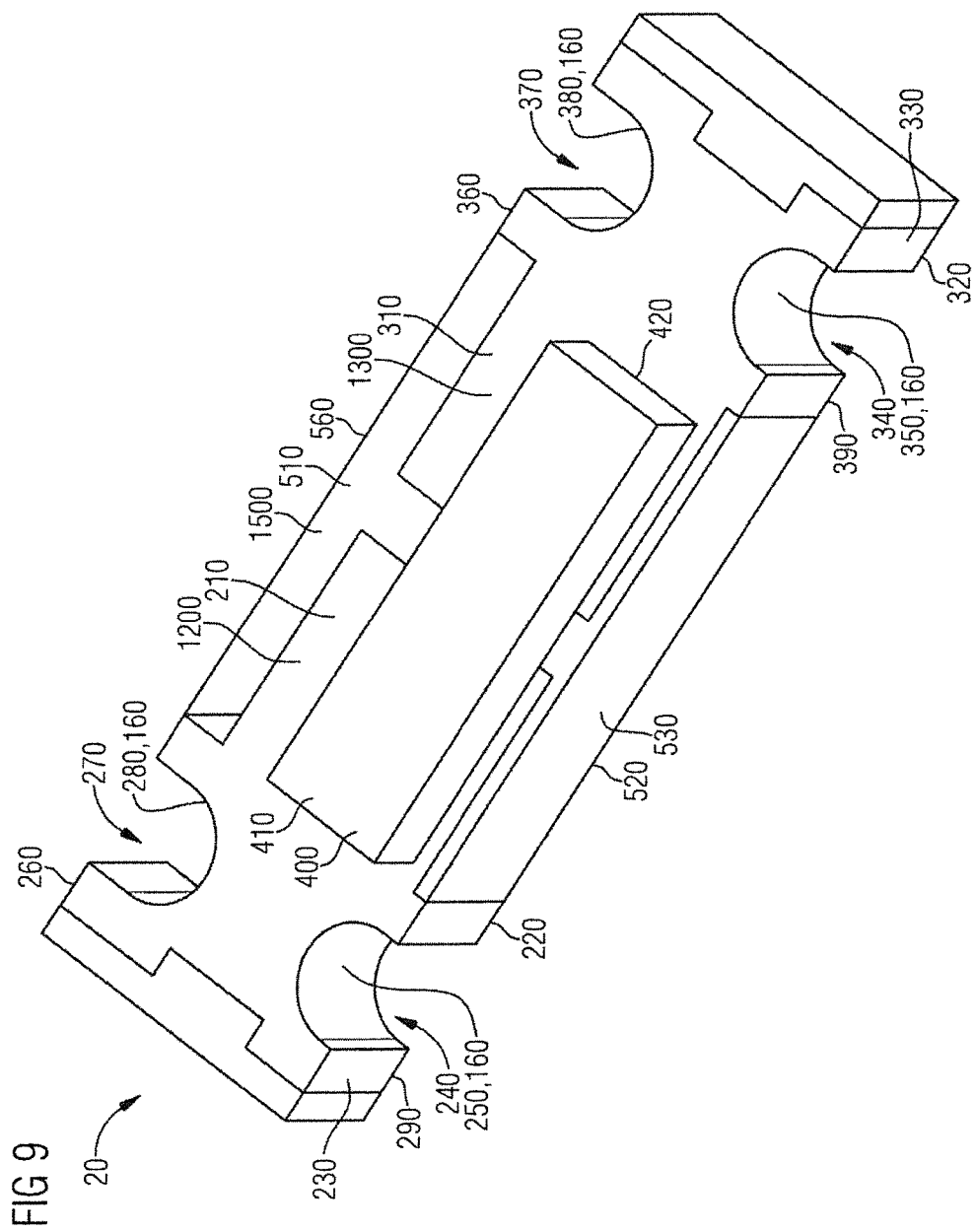
FIG. 9 schematically shows a perspective view of an optoelectronic component formed from the lead frame sections embedded in the molded body.

FIG. 9 shows a schematic perspective representation of the molded body 1500 with the embedded lead frame sections 1200, 1300 in a processing state chronologically following the representation of FIG. 8. Over the upper side 510 of the molded body 1500, an optoelectronic semiconductor chip 400 has been arranged on the upper side 210 of the first lead frame section 1200 and on the upper side 310 of the second lead frame section 1300. An optoelectronic component 20 has in this way been formed. Preferably, the optoelectronic semiconductor chip 400 was arranged on the upper sides 210, 310 of the lead frame sections 1200, 1300 even before the division of the lead frame 1100 and the molded body.

The optoelectronic semiconductor chip 400 of the optoelectronic component 20 of FIG. 9 may be configured in the same way as the optoelectronic semiconductor chip 400 of the optoelectronic component 10 of FIG. 4. In particular, the optoelectronic semiconductor chip 400 of the optoelectronic component 20 may also be configured as a volume-emitting semiconductor chip, for example, as a volume-emitting sapphire flip chip.

In the example shown in FIG. 9, the optoelectronic semiconductor chip 400 is arranged closer to the first side flank 530 of the molded body 1500 than to the second side flank 560 of the molded body 1500. In this way, during mounting of the optoelectronic component 20 with first side flanks 230, 330 of the lead frame sections 1200, 1300 facing toward the upper side of a circuit board, the optoelectronic semiconductor chip 400 is arranged particularly close to the upper side of the circuit board. It would, however, also be possible to arrange the optoelectronic semiconductor chip 400 on the upper side 510 of the molded body 1500, centrally between the first side flank 530 and the second side flank 560 or closer to the second side flank 560 than to the first side flank 530.

A wavelength-converting coating 600 may in turn be arranged on the upper side 410 of the optoelectronic semiconductor chip 400, and optionally also in regions of the upper side 510 of the molded body 1500 and of the upper sides 210, 310 of the lead frame sections 1200, 1300 of the optoelectronic component 20.

Figure 10:
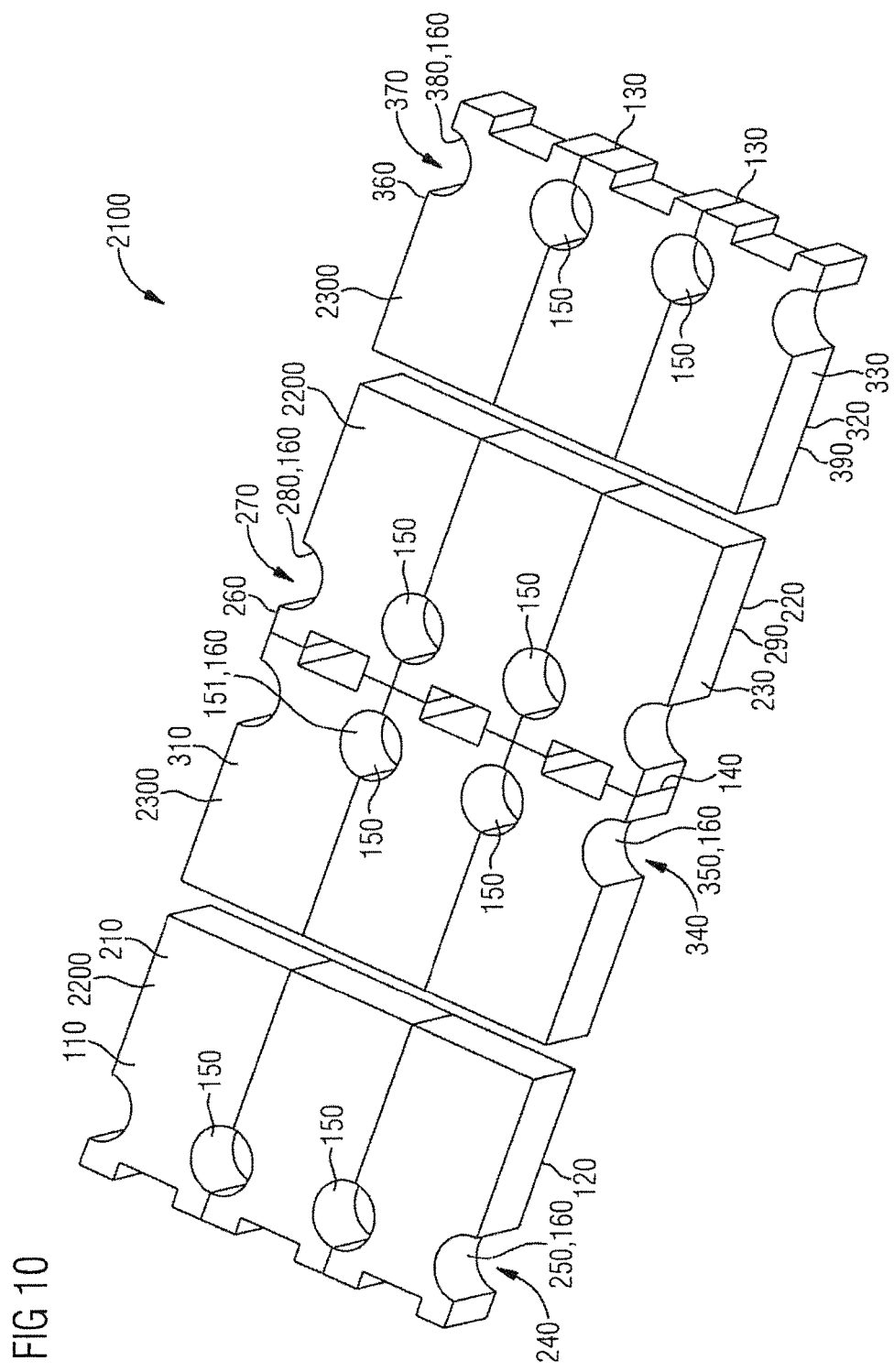
FIG. 10 schematically shows a perspective view of a lead frame according to another example.

FIG. 10 shows a schematic perspective representation of a part of a lead frame 2100 according to another example. The lead frame 2100 comprises a multiplicity of first lead frame sections 2200 and second lead frame sections 2300. The lead frame 2100 with the first lead frame sections 2200 and the second lead frame sections 2300 is configured in essentially the same way as the lead frame 1100 with the first lead frame sections 1200 and the second lead frame sections 1300. In particular, the upper sides 210, 310 of the first lead frame sections 2200 and of the second lead frame sections 2300 are also configured to be essentially planar and without elevated and depressed regions in the lead frame 2100. In other regards, the lead frame 2100 essentially corresponds in shape and function to the lead frame 100 of FIG. 1.

Figure 11:
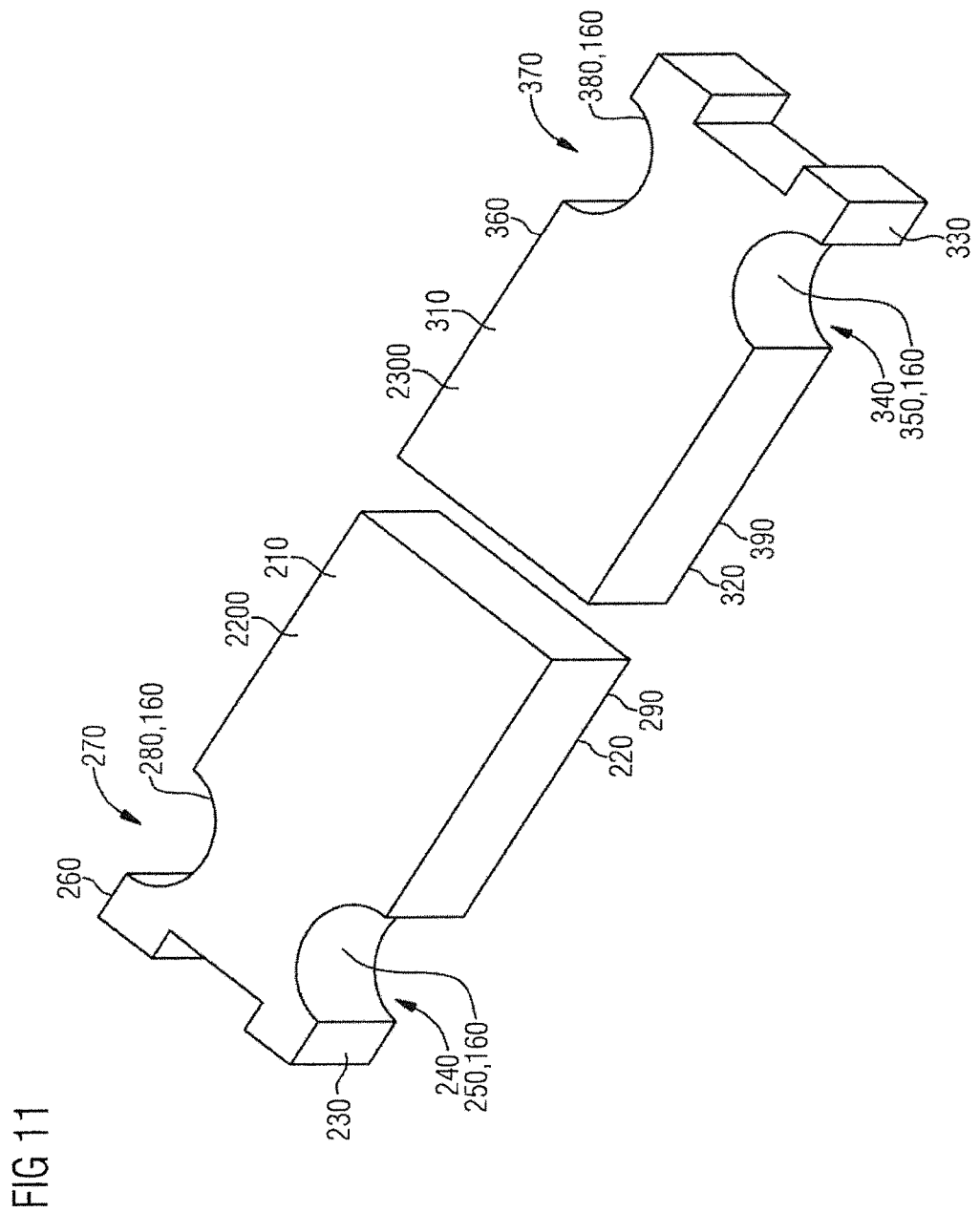
FIG. 11 schematically shows a perspective view of a first lead frame section and a second lead frame section of this lead frame.

FIG. 11 shows a schematic perspective representation of a pair formed by one of the first lead frame sections 2200 and one of the second lead frame sections 2300 of the lead frame 2100.

Figure 12:
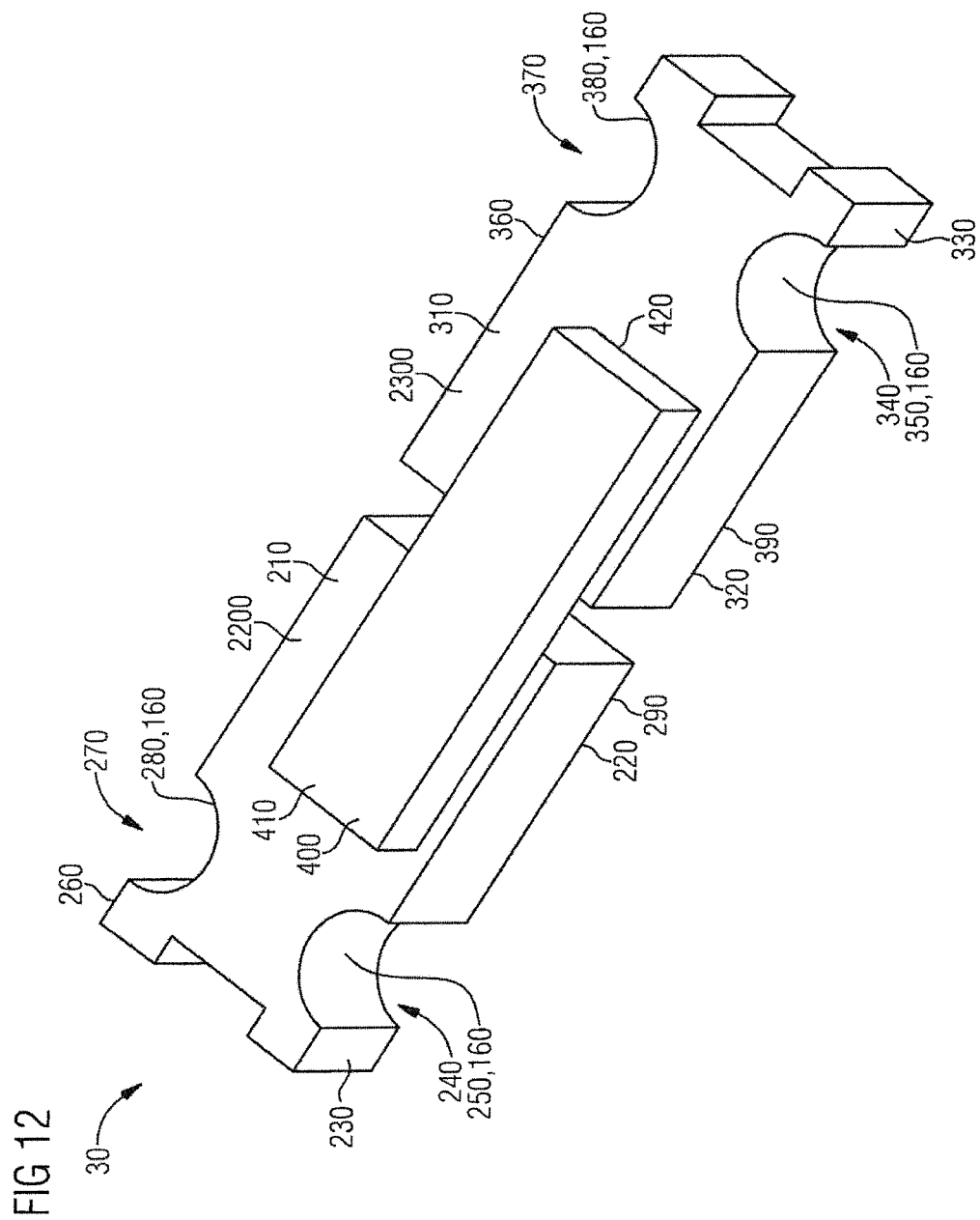
FIG. 12 schematically shows an optoelectronic component formed from these lead frame sections and an optoelectronic semiconductor chip arranged thereon.

FIG. 12 shows a schematic perspective representation of an optoelectronic component 30. The optoelectronic component 30 comprises the first lead frame section 2200 and the second lead frame section 2300 of FIG. 11, as well as an optoelectronic semiconductor chip 400 arranged on the upper side 210 of the first lead frame section 2200 and on the upper side 310 of the second lead frame section 2300. The optoelectronic component 30 of FIG. 12 does not have a molded body, and has no other further supporting housing parts.

The optoelectronic semiconductor chip 400 of the optoelectronic component 30 is configured in the same way as the optoelectronic semiconductor chip 400 of the optoelectronic component 10 of FIG. 4 and as the optoelectronic semiconductor chip 400 of the optoelectronic component 20 of FIG. 9. The optoelectronic semiconductor chip 400 of the optoelectronic component 30 may be configured as a volume-emitting sapphire flip chip. The lower side 420 of the optoelectronic semiconductor chip 400 faces toward the upper sides 210, 310 of the lead frame sections 2200, 2300, and connects thereto by solder connections or adhesive bonds. The optoelectronic semiconductor chip 400 therefore establishes a mechanical connection between the lead frame sections 2200, 2300 of the optoelectronic component 30.

Arrangement of the optoelectronic semiconductor chip 300 on the upper sides 210, 310 of the lead frame sections 2200, 2300 is carried out before the division of the lead frame 2100 on the horizontal separating planes 130 and the vertical separating planes 140.

A wavelength-converting coating 600 may also be arranged on the upper side 410 of the optoelectronic semiconductor chip 400 and, optionally, also on the other parts of the upper sides 210, 310 of the lead frame sections 1200, 1300 in the optoelectronic component 30 of FIG. 12.

Figure 13:
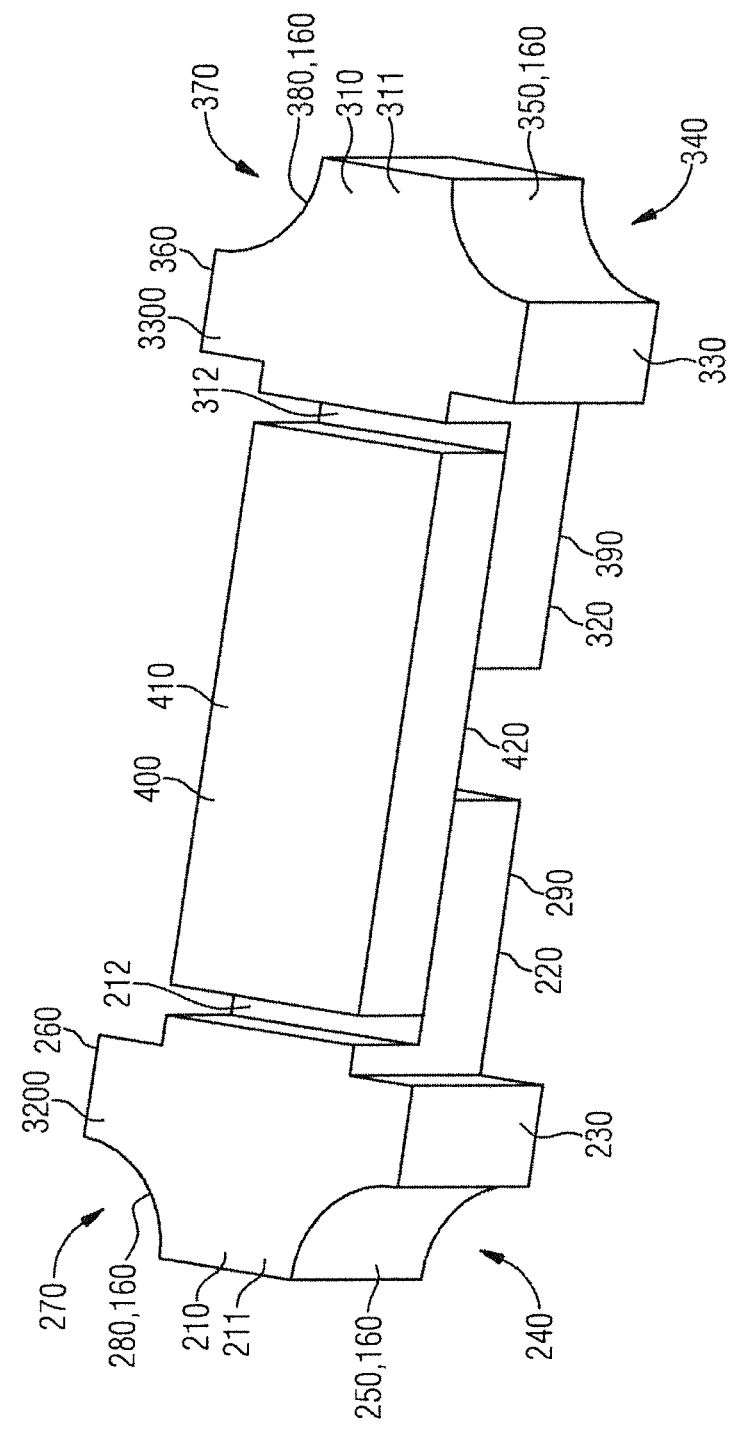
FIG. 13 schematically shows an optoelectronic component according to another example.

FIG. 13 shows a schematic perspective representation of an optoelectronic component 40 according to another example. The optoelectronic component 40 comprises a first lead frame section 3200 and a second lead frame section 3300 having been formed in a similar way to the lead frame sections 200, 300 of the optoelectronic component 10 of FIG. 4 from a lead frame having a multiplicity of such first lead frame sections 3200 and such second lead frame sections 3300. Like the lead frame sections 200, 300 of the optoelectronic component 10, the upper sides 210, 310 of the lead frame sections 3200, 3300 have elevated regions 211, 311 and depressed regions 212, 312.

An optoelectronic semiconductor chip 400 configured in the same way as the optoelectronic semiconductor chips 400 of the optoelectronic components 10, 20, 30 is arranged on the depressed regions 212, 312 of the first lead frame section 3200 and of the second lead frame section 3300 of the optoelectronic component 40.

Like the optoelectronic component 30, the optoelectronic component 40 does not have a molded body. The optoelectronic component 40 has no further supporting housing parts apart from the first lead frame section 3200 and the second lead frame section 3300 and the optoelectronic semiconductor chip 400.

During production of the optoelectronic component 40, besides the horizontal separating planes 130, the vertical separating planes 140 also extend through the through-openings arranged in the lead frame. The recesses 240, 270, 340, 370 forming the lateral solder contact surfaces 250, 280, 350, 380 are therefore arranged in corner regions in the lead frame sections 3200, 3300 of the optoelectronic component 40.

In another example not represented in the figures, the lead frame sections 3200, 3300 and the optoelectronic semiconductor chip 400 of the optoelectronic component 40 may be embedded in a common molded body, as in the optoelectronic component 10 of FIG. 4.

Figure 14:
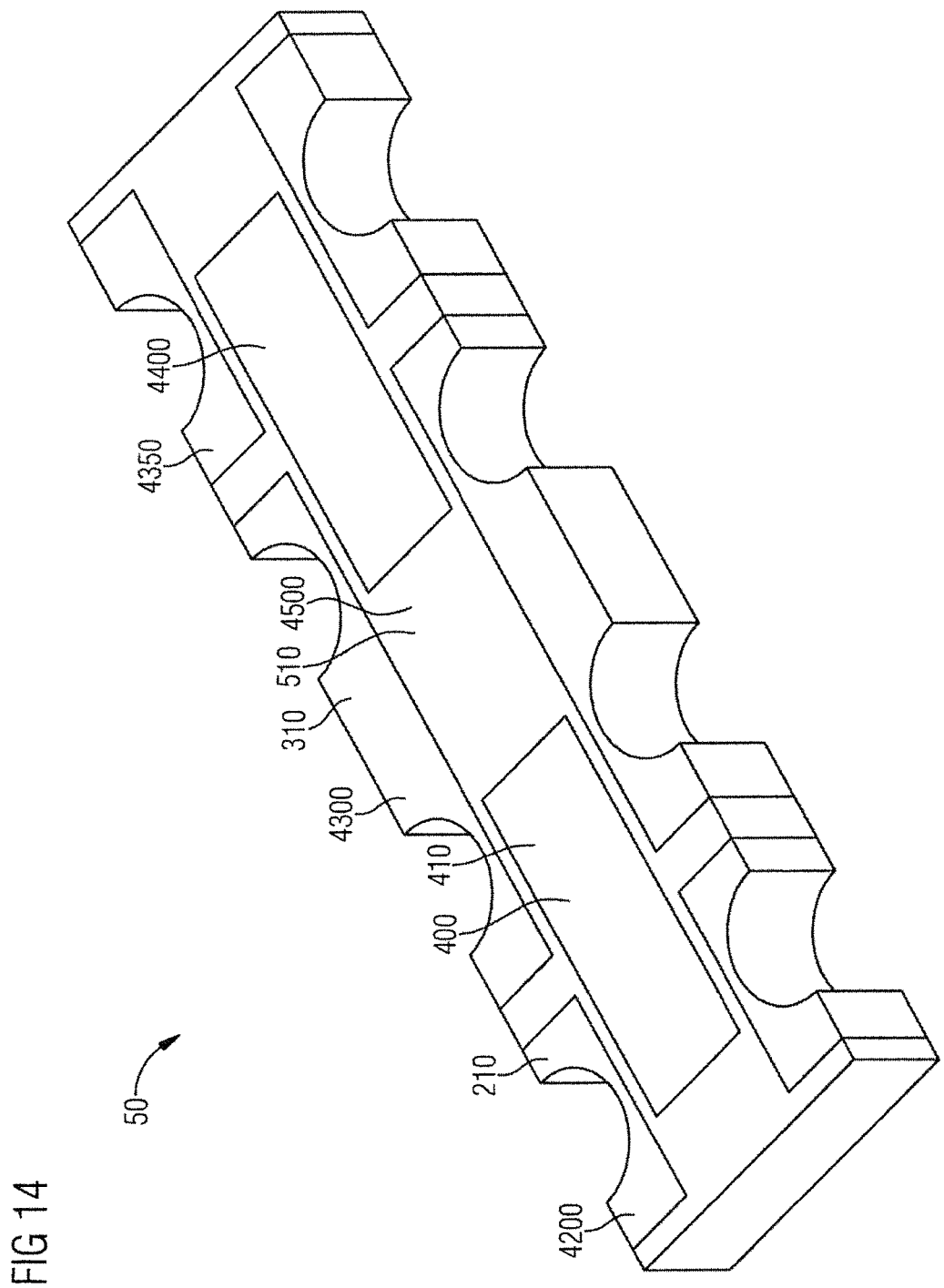
FIG. 14 schematically shows an optoelectronic component according to yet another example.

FIG. 14 shows a schematic perspective representation of an optoelectronic component 50 according to another example. The optoelectronic component 50 has great similarities with the optoelectronic component 10 of FIG. 4. Only the differences between the optoelectronic component 50 and the optoelectronic component 10 will be explained below.

The optoelectronic component 50 has a first lead frame section 4200, a second lead frame section 4300 and a further lead frame section 4350. An optoelectronic semiconductor chip 400 is arranged on the first lead frame section 4200 and the second lead frame section 4300. In addition, a further optoelectronic semiconductor chip 4400, which may be configured in the same way as the optoelectronic semiconductor chip 400, is arranged on the second lead frame section 4300 and on the further lead frame section 4350. The optoelectronic semiconductor chip 400 electrically conductively connects to the first lead frame section 4200 and the second lead frame section 4300. The further optoelectronic semiconductor chip 4400 electrically conductively connects to the second lead frame section 4300 and the further lead frame section 4350. The optoelectronic semiconductor chip 400 and the further optoelectronic semiconductor chip 4400 thus electrically connect in series between the first lead frame section 4200 and the further lead frame section 4350.

The first lead frame section 4200 of the optoelectronic component 50 is configured in the same way as the first lead frame section 200 of the optoelectronic component 10 of FIG. 4. The further lead frame section 4350 of the optoelectronic component 50 is configured in the same way as the second lead frame section 300 of the optoelectronic component 10. The second lead frame section 4300 of the optoelectronic component 50 is configured in the same way as a second lead frame section 300 and a first lead frame section 200 of the lead frame 100, which have not been separated along the vertical separating plane 140 arranged between them. This makes it possible to produce the optoelectronic component 50 from the same lead frame 100 as the optoelectronic component 10 of FIG. 4.

The first lead frame section 4200, the second lead frame section 4300 and the further lead frame section 4350, as well as the optoelectronic semiconductor chip 400 and the further optoelectronic semiconductor chip 4400, are embedded in a common molded body 4500. In this case, the elevated regions 211, 311 of the lead frame sections 4200, 4300, 4350 and the upper sides 410 of the optoelectronic semiconductor chips 400, 4400 are flush with the upper side 510 of the molded body 4500.

It is possible to configure an optoelectronic component with yet further lead frame sections and yet further optoelectronic semiconductor chips. The lead frame 100 of FIG. 1 advantageously makes it possible to produce optoelectronic components which are formed from arbitrarily long chains of lead frame sections 4200, 4300, 4350 and optoelectronic semiconductor chips 400, 4400.

Our components and methods have been illustrated and described in detail with the aid of preferred examples. This disclosure is not, however, restricted to the examples disclosed. Rather, other variants may be derived therefrom by those skilled in the art without departing from the protective scope of the appended claims.

This application claims priority of DE 10 2014 116 133.5, the subject matter of which is incorporated herein by reference.

The invention claimed is:

1. An optoelectronic component comprising a first lead frame section and a second lead frame section spaced apart from one another, and having an optoelectronic semiconductor chip arranged on the first lead frame section and the second lead frame section,
    wherein the first lead frame section and the second lead frame section respectively have an upper side, a lower side and a first side flank extending between the upper side and the lower side,
    a first lateral solder contact surface of the optoelectronic component is formed on the first side flank of the first lead frame section, and
    the first lateral solder contact surface is formed by a recess arranged on the first side flank of the first lead frame section and extends from the upper side to the lower side of the first lead frame section.

2. The optoelectronic component as claimed in claim 1, wherein a first lower solder contact surface of the optoelectronic component is formed on the lower side of first lead frame section.

3. The optoelectronic component as claimed in claim 1, wherein the optoelectronic component has no further supporting housing parts apart from the first lead frame section and the second lead frame section.

4. The optoelectronic component as claimed in claim 1, wherein the first lead frame section and the second lead frame section are embedded together in a molded body.

5. The optoelectronic component as claimed in claim 4, wherein the lower side of the first lead frame section and the lower side of the second lead frame section are flush with a lower side of the molded body.

6. The optoelectronic component as claimed in claim 4, wherein the first side flank of the first lead frame section and the first side flank of the second lead frame section are flush with a first side flank of the molded body.

7. The optoelectronic component as claimed in claim 4, wherein at least a part of the upper side of the first lead frame section and at least a part of the upper side of the second lead frame section are flush with an upper side of the molded body.

8. The optoelectronic component as claimed in claim 4, wherein the optoelectronic semiconductor chip is arranged over the upper side of the molded body.

9. The optoelectronic component as claimed in claim 4, wherein the optoelectronic semiconductor chip is embedded in the molded body, and
    an upper side of the optoelectronic semiconductor chip is flush with the upper side of the molded body.

10. The optoelectronic component as claimed in claim 1, wherein the optoelectronic semiconductor chip is configured as a volume-emitting sapphire flip chip.

11. The optoelectronic component as claimed in claim 1, wherein the optoelectronic component has a further lead frame section spaced apart from the first lead frame section and the second lead frame section, and
    a further optoelectronic semiconductor chip is arranged on the second lead frame section and the further lead frame section.

12. A method of producing an optoelectronic component comprising:
    providing a lead frame having an upper side and a lower side, the lead frame comprising a first lead frame section and a second lead frame section;
    forming a through-opening, extending from the upper side to the lower side, in the lead frame;
    arranging an optoelectronic semiconductor chip on the first lead frame section and the second lead frame section; and
    dividing the lead frame to individualize the optoelectronic component, a separating plane extending through the through-opening during division of the lead frame,
    a first side flank extending from the upper side to the lower side respectively being formed by the division at the first lead frame section and at the second lead frame section on the separating plane,
    a first lateral solder contact surface being formed by a wall of the through-opening on the first side flank of the first lead frame section.

13. The method as claimed in claim 12, further comprising embedding the first lead frame section and the second lead frame section in a molded body.

14. The method as claimed in claim 12, further comprising arranging a solderable coating on the wall of the through-opening.

15. The method as claimed in claim 12, further comprising applying a wavelength-converting coating onto the optoelectronic semiconductor chip by a spray method.

16. A method of producing an optoelectronic arrangement comprising:
    producing an optoelectronic component by the method as claimed in claim 12; and
    arranging the optoelectronic component on a circuit board, the first side flanks of the first lead frame section and the second lead frame section facing toward the circuit board.

17. An optoelectronic component comprising a first lead frame section and a second lead frame section spaced apart from one another, and having an optoelectronic semiconductor chip arranged on the first lead frame section and the second lead frame section,
    wherein the first lead frame section and the second lead frame section respectively have an upper side, a lower side and a first side flank extending between the upper side and the lower side,
    a first lateral solder contact surface of the optoelectronic component is formed on the first side flank of the first lead frame section,
    the first lateral solder contact surface is formed by a recess arranged on the first side flank of the first lead frame section and extends from the upper side to the lower side of the first lead frame section,
    the first lead frame section and the second lead frame section respectively have a second side flank lying opposite the first side flank, and
    a third lateral solder contact surface of the optoelectronic component is formed on the second side flank of the first lead frame section.

18. The optoelectronic component as claimed in claim 17, wherein the optoelectronic semiconductor chip is arranged closer to the first side flank than to the second side flank.

* * * * *